(12) United States Patent
Maede

(10) Patent No.: US 7,683,728 B2
(45) Date of Patent: Mar. 23, 2010

(54) OSCILLATION CIRCUIT

(75) Inventor: Masato Maede, Osaka (JP)

(73) Assignee: Panasonic Corporation, Osaka (JP)

( * ) Notice: Subject to any disclaimer, the term of this patent is extended or adjusted under 35 U.S.C. 154(b) by 93 days.

(21) Appl. No.: 11/941,197

(22) Filed: Nov. 16, 2007

(65) Prior Publication Data

US 2008/0116984 A1    May 22, 2008

(30) Foreign Application Priority Data

Nov. 22, 2006    (JP)    ............... 2006-315535

(51) Int. Cl.
*H03B 5/36*    (2006.01)
(52) U.S. Cl. ............... 331/116 FE; 331/62; 331/158
(58) Field of Classification Search ............... 331/62, 331/158, 116 FE, 108 C, 108 D
See application file for complete search history.

(56) References Cited

U.S. PATENT DOCUMENTS

| | | | |
|---|---|---|---|
| 5,929,715 A | 7/1999 | Nakamiya et al. | |
| 6,147,564 A | 11/2000 | Nakamiya et al. | |
| 6,320,473 B1 * | 11/2001 | Leuschner | 331/116 FE |
| 6,933,797 B2 | 8/2005 | Miyahara et al. | |
| 2002/0070817 A1 | 6/2002 | Nakamiya et al. | |
| 2006/0214740 A1 | 9/2006 | Sheng | |

FOREIGN PATENT DOCUMENTS

JP    09-148845    6/1997

* cited by examiner

*Primary Examiner*—Joseph Chang
(74) *Attorney, Agent, or Firm*—McDermott Will & Emery LLP

(57) ABSTRACT

An oscillation circuit according to the present invention comprises a solid-state oscillator, an amplifier for feedback-controlling the solid-state oscillator, and ESD protecting circuits respectively connected to the input and output sides of the amplifier, wherein the ESD protecting circuit on the input side of the amplifier comprises an ESD protecting element whose constituent is a diode having a P-type diffusion layer and an N-type diffusion layer, and the ESD protecting circuit on the output side of the amplifier comprises an ESD protecting element whose constituent is an MOS transistor.

5 Claims, 6 Drawing Sheets

F I G. 1
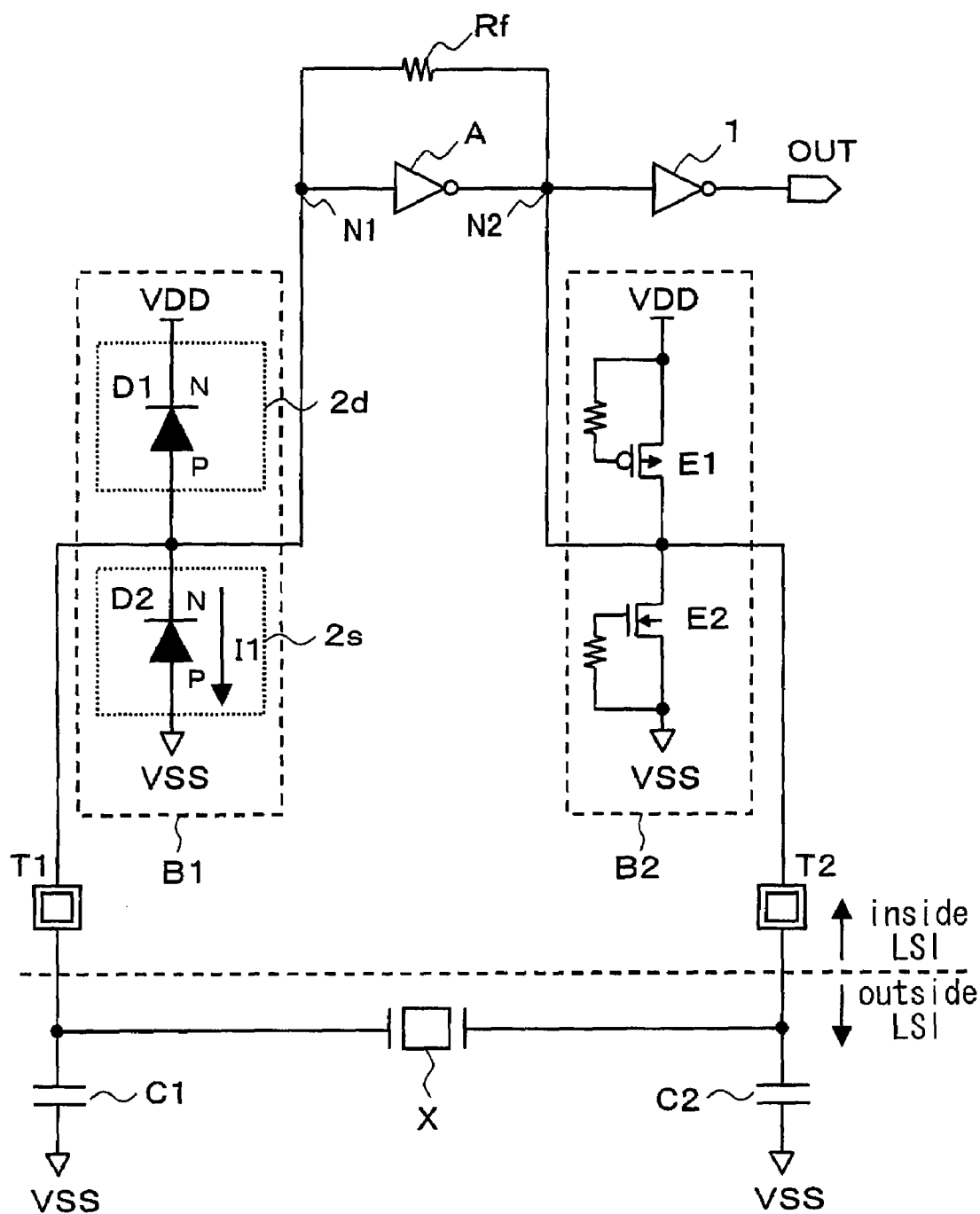

OSCILLATION CIRCUIT

BACKGROUND OF THE INVENTION

1. Field of the Invention

The present invention relates to an oscillation circuit for outputting an oscillation waveform from an output terminal of an amplifier after feedback-controlling a solid-state oscillator using the amplifier, more particularly to a technology for protecting the circuit from the ESD (electrostatic discharge), more specifically, for protecting the circuit from a surge voltage resulting from the electrostatic discharge.

2. Description of the Related Art

FIG. 5 shows a circuit configuration of an oscillation circuit including an amplifier and a solid-state oscillator according to the conventional technology. A solid-state oscillator X formed from a ceramic oscillator, a crystalline oscillator or the like is connected to between a bonding pad T1 and a bonding pad T2. The solid-state oscillator X is provided outside of the LSI. Between connecting points of the solid-state oscillator X on both sides thereof and a low-voltage-side power supply VSS (GND) are respectively provided oscillation capacitance elements C1 and C2. Inside the LSI, an input terminal of an amplifier A is connected to the bonding pad T1, and an output terminal of the amplifier A is connected to the bonding pad T2. A bias feedback resistor Rf is connected to both ends of the amplifier A. In the drawing, a typical example of the amplifier A, which is an inverter (inversion amplifier), is shown. An oscillation output terminal OUT is connected to the output terminal of the amplifier A via a waveform shaping circuit 1. An input-side ESD protecting circuit B1' is inserted between the input terminal of the amplifier A and the bonding pad T1, and an output-side ESD protecting circuit B2 is inserted between the output terminal of the amplifier A and the boding pad T2. The input-side ESD protecting circuit B1' comprises a power-supply-side ESD protecting element G1 and a ground-side ESD protecting element G2. The output-side ESD protecting circuit B2 comprises a power-supply-side ESD protecting element E1 and a ground-side ESD protecting element E2.

A P-channel-type MOS transistor constitutes each of the power-supply-side ESD protecting elements G1 and E1 provided on the upper side in the drawing. Gates of the power-supply-side ESD protecting elements (transistors) G1 and E1 are connected to sources and a power-supply wire via resistors. Drains of the power-supply-side ESD protecting elements (transistors) G1 and E1 on one side are connected to a node N1 which is the input terminal of the amplifier A, and drains of the power-supply-side ESD protecting elements G1 and E1 on the other side are connected to a node N2 which is the output terminal of the amplifier A.

An N-channel-type MOS transistor constitutes each of the ground-side ESD protecting elements G2 and E2 provided on the lower side in the drawing. Gates of the ground-side ESD protecting elements G2 and E2 are connected to sources and a ground wire via resistors. Drains of the ground-side ESD protecting elements (transistors) G2 and E2 on one side are connected to the node N1 which is the input terminal of the amplifier A, and drains of the ground-side ESD protecting elements G2 and E2 on the other side are connected to the node N2 which is the output terminal of the amplifier A.

In the oscillation circuit thus constituted, the solid-state oscillator X is connected to the bonding pad T1 and the bonding pad T2 to generate the oscillation, and a waveform of the oscillation is inputted to the amplifier A. The bias feedback resistor Rf is operated in an active region by the inverter (amplifier A) used as the inversion amplifier, and the positive feedback control is thereby executed to the solid-state oscillator X via the amplifier A. The oscillation capacitance elements C1 and C2 invert a phase of an oscillation signal in cooperation with the solid-state oscillator X (particularly, its inductive property).

In the described manner, an amplitude of the oscillation is gradually increased, and the oscillation is then continued in a state where the amplitude is stabilized after a certain period of time. The stabilized oscillation waveform is shaped by the waveform shaping circuit 1, and then outputted from the oscillation output terminal OUT and supplied to the LSI. In the normal operation, the power-supply-side ESD protecting element G1 and the ground-side ESD protecting element G2 are in the non-conductive state, and the power-supply-side ESD protecting element E1 and the ground-side ESD protecting element E2 are also in the non-conductive state.

When the surge voltage resulting from the electrostatic discharge is applied to the bonding pad T1 from outside, the ESD protecting circuit B1' on the input side is operated. More specifically, when the positive surge voltage is applied, the avalanche breakdown makes the power-supply-side ESD protecting element G1 conducted, and the generated charges are thereby speedily let out to the power-supply wire VDD. When the negative surge voltage is applied, the avalanche breakdown makes the ground-side ESD protecting element G2 conducted, and the generated charges are thereby speedily let out to the ground wire VSS.

When the surge voltage resulting from the electrostatic discharge is applied to the bonding pad T2 from outside, the ESD protecting circuit B2 on the output side is operated. More specifically, when the positive surge voltage is applied, the avalanche breakdown makes the power-supply-side ESD protecting element E1 conducted, and the generated charges are thereby speedily let out to the power-supply wire VDD. When the negative surge voltage is applied, the avalanche breakdown makes the ground-side ESD protecting element E2 conducted, and the generated charges are thereby speedily let out to the ground wire VSS.

FIG. 6 shows a circuit configuration of another oscillation circuit including an amplifier and a solid-state oscillator according to the conventional technology. In FIG. 6, the same reference symbols as those shown in FIG. 5 denote the same components. The configuration shown in FIG. 6 is characterized in that a diode is a main circuit element in each of an input-side ESD protecting circuit B1 and an output-side ESD protecting circuit B3. The input-side ESD protecting circuit B1 comprises a power-supply-side ESD protecting element 2d and a ground-side ESD protecting element 2s. The output-side ESD protecting circuit B3 comprises a power-supply-side ESD protecting element 6d and a ground-side ESD protecting element 6s. A diode D1 constitutes the powers-supply side ESD protecting element 2d, and a diode D5 constitutes the power-supply-side ESD protecting element 6d. A diode D2 constitutes the ground-side ESD protecting element 2s, and a diode D6 constitutes the ground-side ESD protecting element 6s.

In the power-supply-side ESD protecting element 2d (diode D1) provided on the upper side in the drawing, an N-type diffusion layer is connected to the power-supply wire VDD, and a P-type diffusion layer is connected to a node N1 on the input side of the amplifier A. In the ground-side ESD protecting element 2s (diode D2) provided on the lower side in the drawing, a P-type diffusion layer is connected to the ground wire VSS, and an N-type diffusion layer is connected to the node N1. In the power-supply-side ESD protecting element 6d (diode D5) provided on the upper side in the drawing, an N-type diffusion layer is connected to the power-supply wire VDD, and a P-type diffusion layer is connected to a node N2 on the output side of the amplifier A. In the ground-side ESD protecting element 6s (diode D6) provided on the lower side in the drawing, a P-type diffusion layer is connected to the ground wire VSS, and an N-type diffusion layer is connected to the node N2.

In the oscillation circuit shown in FIG. 6, the oscillation waveform is outputted from the oscillation output terminal OUT and supplied to the LSI in a manner similar to the oscillation circuit shown in FIG. 5. In the normal operation, the power-supply-side ESD protecting element D1 and the ground-side ESD protecting element D2 are in the non-conductive state, and the power-supply-side ESD protecting element D5 and the ground-side ESD protecting element D6 are also in the non-conductive state.

When the surge voltage resulting from the electrostatic discharge is applied to the bonding pad T1 from outside, the ESD protecting circuit B1 on the input side is operated. When the surge voltage resulting from the electrostatic discharge is applied to the bonding pad T2 from outside, the ESD protecting circuit B3 on the output side is operated. As a result, the charges generated from the application of the surge voltage are thereby speedily let out to the ground wire VSS or the power-supply wire VDD.

In the oscillation circuits shown in FIG. 5, a parasitic capacitance generated inside may prevent the output of the oscillation waveform from the oscillation output terminal OUT. More specifically, when the oscillation circuit is being oscillated, a potential of the gate of the MOS transistor is increased by the parasitic capacitance (coupling capacitance Cp) generated between the gate of the N-channel MOS transistor in the ground-side ESD protecting element G2 and the node N1, and a potential between the relevant gate and source becomes at least a threshold voltage of the MOS transistor. As a result, the MOS transistor is conducted without the application of the surge voltage, which generates the flow of an ON current I1 to the ground wire VSS. The flow of the current I1 thus generated is drawn to the ground-wire side, and the amplitude of the oscillation waveform, which is originally supposed to be 3.3 V, thereby becomes lower than 3.3 V.

FIG. 7 shows the states of the oscillation waveforms at the node N1, node N2 and oscillation output terminal OUT. Under the influence of the current I1, the amplitude of the oscillation waveform at the node N1 is between a voltage smaller than 3.3 V (for example, 2.0 V) and 0 V. The amplitude of the oscillation waveform at the node N2 is between a voltage larger than 0 V (for example, 3.3−2.0=1.3 V) and 3.3 V because the oscillation waveform at the node N1 is inverted by the amplifier A (inverter). However, the oscillation circuit is subject to such a condition that the oscillation waveform at the node N2 (for example, 1.3 V–3.3 V) cannot exceed a threshold voltage on the L-level side of the waveform shaping circuit 1 (inverter). Therefore, the oscillation waveform is not outputted to the oscillation output terminal OUT, and the voltage outputted from the relevant terminal constantly has the waveform of 0 V. In other words, the oscillation waveform cannot be outputted from the oscillation output terminal OUT due to the parasitic coupling capacitance Cp.

In the oscillation circuit shown in FIG. 6, when the surge voltage resulting from the electrostatic discharge is applied to the bonding pad from outside, the amplifier A may be broken down because the MOS transistor constitutes the amplifier A. Below is described a reason for the possible breakdown. If the ESD protecting circuit B3 shown in FIG. 6 is configured in a manner similar to the ESD protecting circuit shown in FIG. 5 (MOS transistor is its main circuit element), breakdown voltages of the MOS transistor of the amplifier A and the ESD protecting circuit B3 are equal to each other, which prevents the breakdown of the amplifier A caused by the surge voltage. However, in the ESD protecting circuit B3 shown in FIG. 6, in which the diode is its main circuit element, the breakdown voltage of the MOS transistor of the amplifier A is lower than the breakdown voltage of the ESD protecting circuit B3. Accordingly, the amplifier A may be broken down when the surge voltage resulting from the electrostatic discharge is applied to the bonding pad from outside.

SUMMARY OF THE INVENTION

Therefore, a main object of the present invention is to provide an oscillation circuit capable of preventing an oscillation waveform from being drawn to the ground-wire side or the power-supply-wire side during the oscillation due to a parasitic coupling capacitance and outputting a normal oscillation waveform having a full amplitude from an oscillation output terminal, and thereby being protected from a surge voltage resulting from the electrostatic discharge.

An oscillation circuit according to the present invention comprises:

a solid-state oscillator;

an amplifier for feedback-controlling the solid-state oscillator; and

ESD protecting circuits respectively connected to input and output sides of the amplifier, wherein the ESD protecting circuit on the input side of the amplifier comprises an ESD protecting element whose constituent is a diode having a P-type diffusion layer and an N-type diffusion layer, and the ESD protecting circuit on the output side of the amplifier comprises an ESD protecting element whose constituent is an MOS transistor.

In the foregoing constitution, an MOS transistor preferably constitutes the amplifier.

According to the constitution, wherein the ESD protecting circuit on the input side of the amplifier comprises the ESD protecting element whose constituent is the diode having the P-type diffusion layer and N-type diffusion layer, any current flow on the ground-wire side or the power-supply-wire side during the oscillation is only a junction leak current. As a result, the current flow on the ground-wire side or the power-supply-wire side is not so large as the oscillation waveform is drawn. Therefore, the oscillation waveform can obtain a full amplitude both on the input and output sides of the amplifier, and the full amplitude waveform can be outputted from the oscillation output terminal. Further, the ESD protecting circuit provided on the output side of the amplifier comprises the ESD protecting element whose constituent is the MOS transistor. Therefore, the breakdown voltage of the ESD protecting circuit is thereby equal to the breakdown voltage of the amplifier. As a result, the breakdown of the amplifier by the surge voltage can be prevented though the surge voltage resulting from the electrostatic discharge is applied from outside to the oscillation circuit.

In the oscillation circuit thus constituted, the ESD protecting circuit on the input side of the amplifier preferably comprises:

a power-supply-side ESD protecting element; and a ground-side ESD protecting element, wherein a diode in which an N-type diffusion layer is connected to a power-supply wire and a P-type diffusion layer is connected to the input side of the amplifier constitutes the power-supply-side ESD protecting element, and a diode in which a P-type diffusion layer is connected to a ground wire and an N-type diffusion layer is connected to the input side of the amplifier constitutes the ground-side ESD protecting element.

The foregoing constitution can flexibly respond to any surge voltage, if it is the positive surge voltage or negative surge voltage, and the full amplitude waveform can be outputted from the oscillation output terminal during the oscillation in a manner similar to the constitution described earlier.

In the oscillation circuit thus constituted, the ESD protecting circuit on the input side of the amplifier preferably comprises:

a resistance element;
a power-supply-side ESD protecting element; and
a ground-side ESD protecting element, wherein
the resistance element is provided on a signal wire for supplying a signal to the amplifier, and
a diode in which an N-type diffusion layer is connected to a power-supply wire, a part of a P-type diffusion layer is connected to a connecting point between the amplifier and one end of the resistance element, and another part of the P-type diffusion layer is connected to the other end of the resistance element constitutes the power-supply-side ESD protecting element, and
a diode in which a P-type diffusion layer is connected to the ground wire, a part of an N-type diffusion layer is connected to the connecting point between the amplifier and the one end of the resistance element, and another part of the N-type diffusion layer is connected to the other end of the resistance element constitutes the ground-side ESD protecting element.

As a preferable mode of the foregoing constitution, the diode constituting the power-supply-side ESD protecting element comprises:

a first diode in which an N-type diffusion layer is connected to the power-supply wire and a P-type diffusion layer is connected to the connecting point between the amplifier and one end of the resistance element; and
a second diode in which an N-type diffusion layer is connected to the power-supply wire and a P-type diffusion layer is connected to the other end of the resistance element, and
the diode constituting the ground-side ESD protecting element comprises:
a third diode in which a P-type diffusion layer is connected to the ground wire and an N-type diffusion layer is connected to the connecting point between the amplifier and one end of the resistance element; and
a fourth diode in which a P-type diffusion layer is connected to the ground wire and an N-type diffusion layer is connected to the other end of the resistance element.

According to the mode, the power-supply-side and ground-side ESD protecting elements are both provided with two stages. Therefore, the remaining surge current which could not be discharged in the first ESD protecting circuit can be discharged completely in the resistance element and the second ESD protecting element in the latter stage even though the surge current having a high speed is inputted to the oscillation circuit. As a result, the ESD breakdown voltage can be improved. The polysilicon preferably constitutes the resistance element.

According to the present invention, wherein the ESD protecting circuit on the input side of the amplifier comprises the ESD protecting element formed from the diode having the P-type diffusion layer and the N-type diffusion layer, any current flow on the ground-wire side or the power-supply-wire side during the oscillation is only a junction leak current. As a result, the current flow on the ground-wire side or the power-supply-wire side is not so large as the oscillation waveform is drawn. Therefore, the oscillation waveform can obtain a full amplitude both on the input and output sides of the amplifier, and the full amplitude waveform can be outputted from the oscillation output terminal. Further, the ESD protecting circuit provided on the output side of the amplifier is the MOS transistor. Therefore, the breakdown voltage of the ESD protecting circuit and the breakdown voltage of the amplifier are equal to each other. As a result, the breakdown of the amplifier by the surge voltage can be prevented though the surge resulting from the electrostatic discharge is applied from outside to the oscillation circuit.

The oscillation circuit according to the present invention is effectively applicable when the oscillation circuit is oscillated at a high frequency by the amplifier and solid-state oscillator.

BRIEF DESCRIPTION OF THE DRAWINGS

These and other objects as well as advantages of the invention will become clear by the following description of preferred embodiments of the invention and they will be specified in the claims attached hereto. A number of benefits not recited in this specification will come to the attention of the skilled in the art upon the implementation of the present invention.

FIG. 1 is a circuit diagram illustrating a constitution of an oscillation circuit according to a preferred embodiment 1 of the present invention.

DETAILED DESCRIPTION OF THE INVENTION

Figure 2:
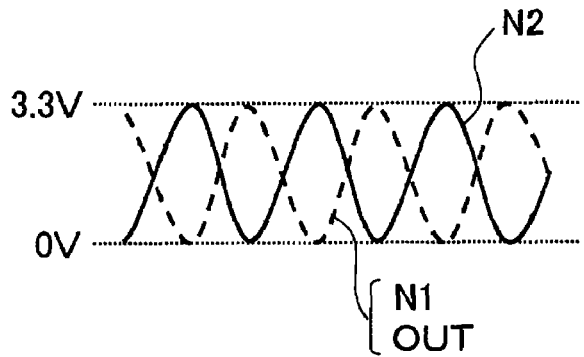
FIG. 2 shows oscillation waveforms at respective nodes in the oscillation circuit according to the preferred embodiment 1.

Hereinafter, preferred embodiments of an oscillation circuit according to the present invention are described in detail referring to the drawings.

Preferred Embodiment 1

Figure 5:
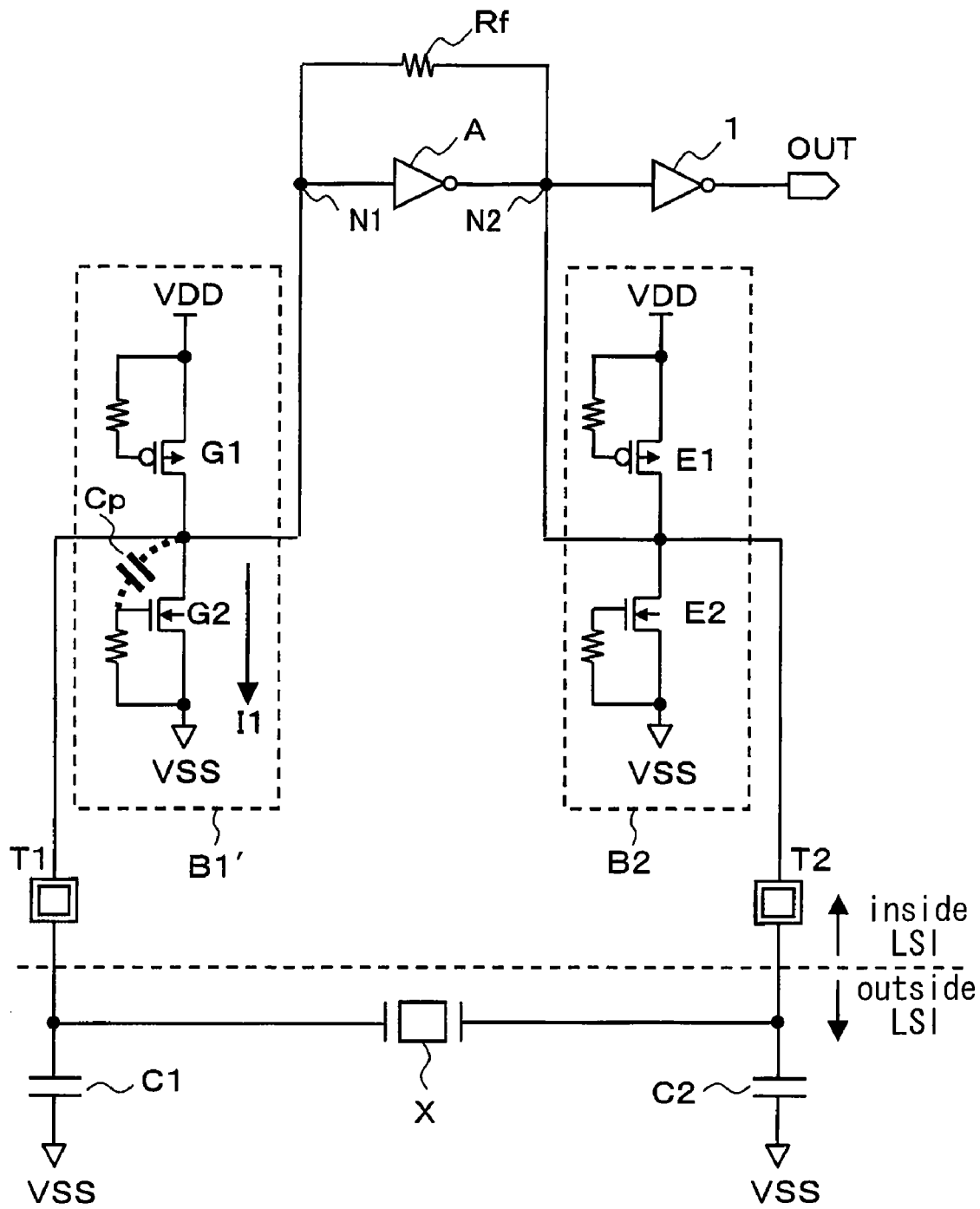
FIG. 5 is a circuit diagram illustrating a constitution of an oscillation circuit according to a conventional technology.
Figure 6:
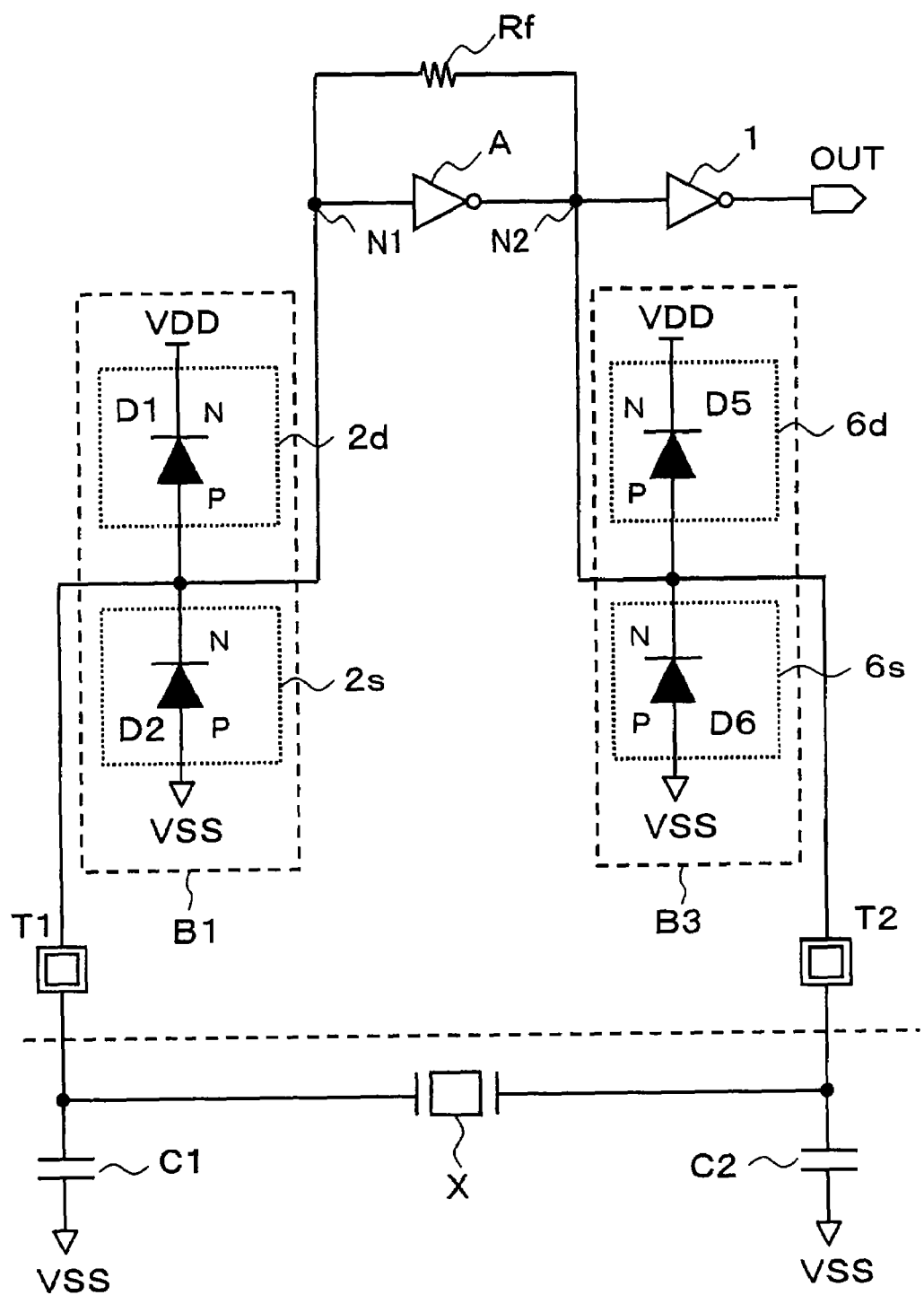
FIG. 6 is a circuit diagram illustrating a constitution of another oscillation circuit according to the conventional technology.
Figure 7:
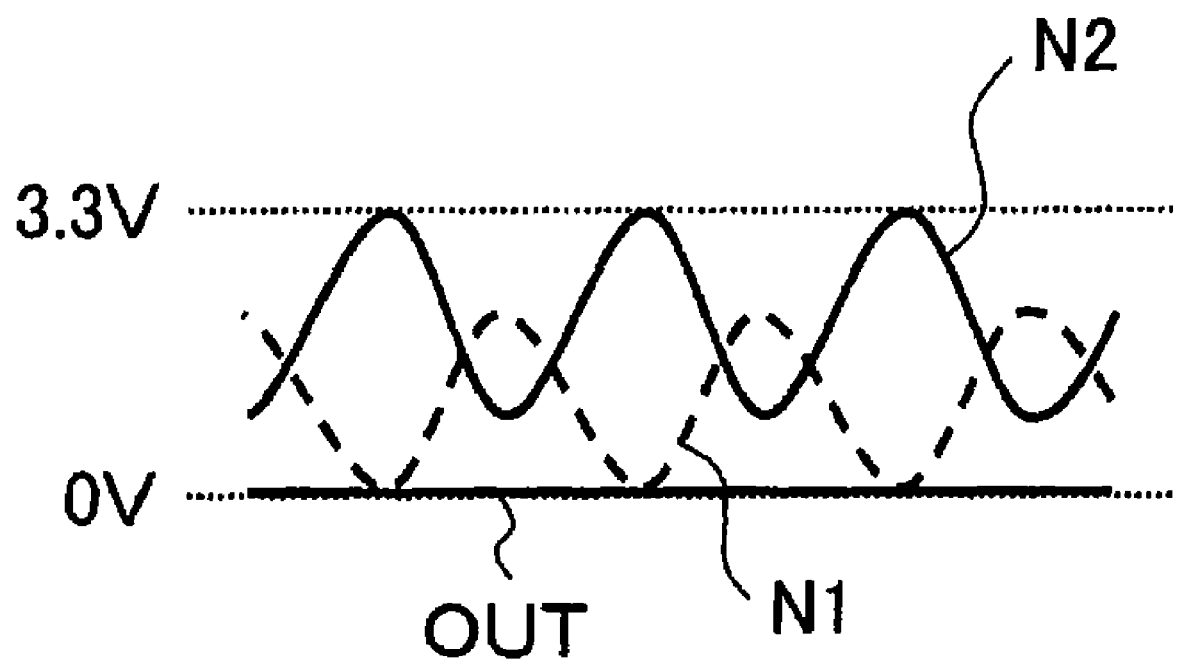
FIG. 7 shows oscillation waveforms at respective nodes in the oscillation circuit according to the conventional technology.

FIG. 1 is a circuit diagram illustrating a constitution of an oscillation circuit according to a preferred embodiment 1 of the present invention. In FIG. 1, the same reference symbols as those shown in FIG. 5 according to the conventional technology denote the same components and will not be described in detail below. In the conventional technology, the ESD protecting circuit B1' on the input side of the amplifier A comprises the ESD protecting element whose constituent is the MOS transistor. In the present preferred embodiment, an input-side ESD protecting circuit comprises an ESD protecting element whose constituent is a diode.

Below is given a description. Referring to reference symbols shown in FIG. 1, T1 and T2 each denote a bonding pad, A denotes an amplifier which outputs an oscillation waveform from an output terminal thereof, X denotes a solid-state oscillator which is a piezoelectric oscillator such as a ceramic radiator or a crystalline radiator, C1 and C2 each denote an oscillation capacitance element for phase inversion. Rf denotes a bias feedback resistor, 1 denotes a waveform shaping circuit, OUT denotes an oscillation output terminal (corresponding to an output terminal of the amplifier A), B1 denotes an input-side ESD protecting circuit, B2 denotes an output-side ESD protecting circuit, E1 denotes a power-supply-side MOS ESD protecting element, and E2 denotes a ground-side MOS ESD protecting element. Both ends of the solid-state oscillator X are connected to an input terminal or an output terminal of the amplifier A.

In the oscillation circuit according to the present preferred embodiment, the solid-state oscillator X is connected to the bonding pads T1 and T2 to generate the oscillation, and a waveform of the oscillation is inputted to the amplifier A in a manner similar to the conventional technology. The bias feedback resistor Rf is operated in an active region by an inverter (amplifier A) used as an inversion amplifier. As a result, the positive feedback control is executed to the solid-state oscillator X via the amplifier A. The oscillation capacitance elements C1 and C2 invert a phase of an oscillation signal in cooperation with the solid-state oscillator X (particularly, its inductive property).

The present preferred embodiment is characterized in that the input-side ESD protecting circuit B1 is provided between the input terminal of the amplifier A and the bonding pad T1, and the ESD protecting circuit B1 has a circuit configuration of a diode type that comprises a P-type diffusion layer and an N-type diffusion layer. The ESD protecting circuit B1 comprises a power-supply-side ESD protecting element 2d and a ground-side ESD protecting element 2s. A diode D1 constitutes the power-supply-side ESD protecting element 2d, and a diode D2 constitutes the ground-side ESD protecting element 2s. In the power-supply-side ESD protecting element 2d (diode D1) provided on the upper side in the drawing, the N-type diffusion layer is connected to a power-supply wire VDD, and the P-type diffusion layer is connected a node N1 (input terminal of the amplifier A) on the input side of the amplifier A. In the ground-side ESD protecting element 2s (diode D2) provided on the lower side in the drawing, the P-type diffusion layer is connected to a ground wire VSS, and the N-type diffusion layer is connected the node N1. The description of the rest of the constitution, which is similar to that of the conventional technology, is omitted.

The operation of the oscillation circuit according to the present preferred embodiment thus constituted is described. When the oscillation circuit according to the present preferred embodiment is being oscillated, a current flow from the node N1 to the ground wire VSS is only the flow of a junction leak current I1 in the diode D2 in the ground-side ESD protecting element 2s. The junction leak current I1, which is a very small current, does not draw the oscillation waveform at the node N1 to the ground-wire-VSS side. FIG. 2 shows the oscillation waveforms at the node N1, node N2 (output terminal of the amplifier A) and oscillation output terminal OUT (the output thereof is inverted relative to the node N2).

The oscillation waveform at the node N1 has a waveform shape that has a full amplitude between 0 V and 3.3 V. The oscillation waveform at the node N2, which is the waveform inverted by the amplifier A from the wave form at the node N1, has a waveform shape that has a full amplitude between 0 V and 3.3 V. Therefore, the oscillation waveform outputted from the oscillation output terminal OUT has such a waveform as is obtained when the oscillation waveform at the node N2 is inverted by the waveform shaping circuit 1. As a result, the waveform has a waveform shape that has a full amplitude between 0 V and 3.3 V, and the normal oscillation waveform is outputted.

Figure 3:
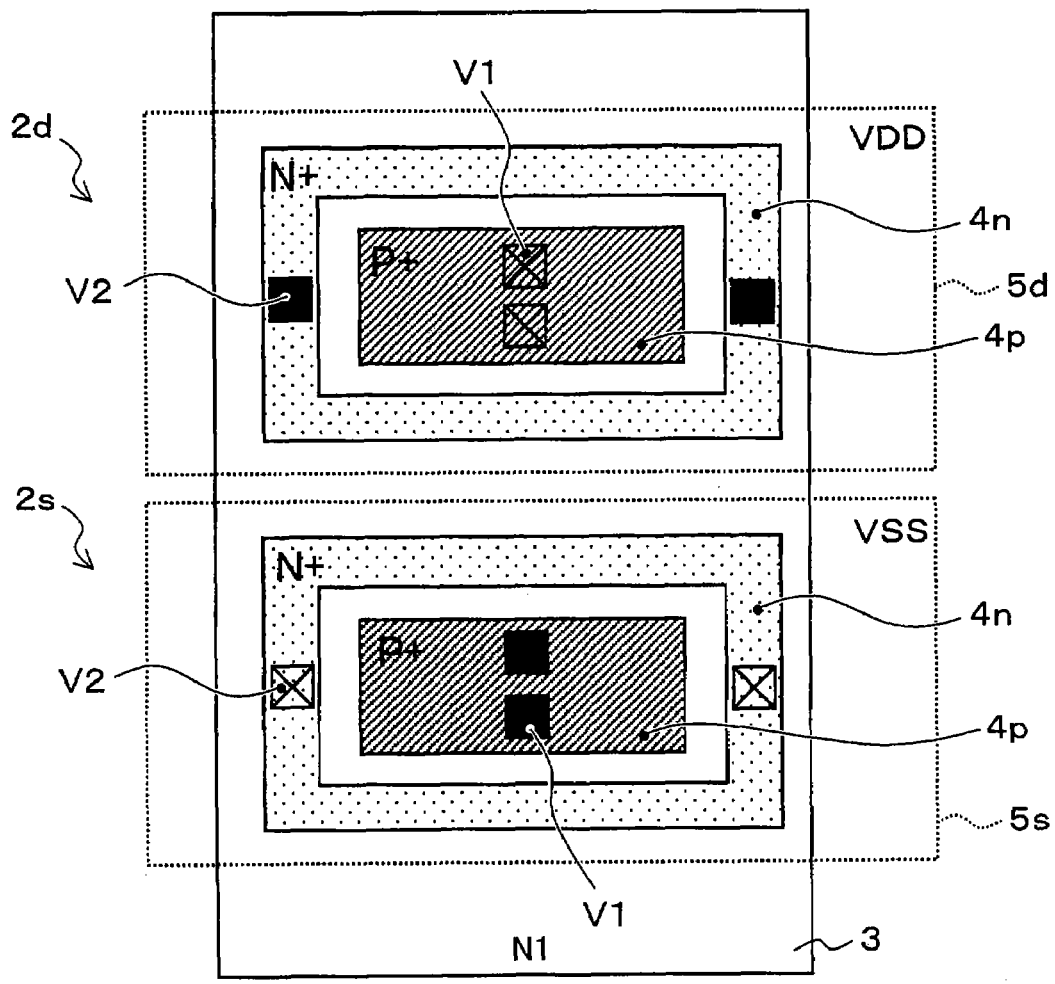
FIG. 3 shows a layout of a diode ESD protecting circuit in the oscillation circuit according to the preferred embodiment 1.

FIG. 3 shows a layout of the ESD protecting elements (diode D1 and D2) constituting the ESD protecting circuit B1 on the input side shown in FIG. 1. Referring to reference symbols, 3 denotes a wiring connected to the node N1, 4p denotes a P$^+$ diffusion layer, 4n denotes a N$^+$ diffusion layer, 5d denotes a VDD wiring, and 5s denotes a VSS wiring.

The P$^+$ diffusion layer 4p has a rectangular shape. The N$^+$ diffusion layer 4n has a hollow rectangle shape which surrounds the P$^+$ diffusion layer 4p with a certain distance from the P$^+$ diffusion layer 4p. The P$^+$ diffusion layer 4p and the N$^+$ diffusion layer 4n constitute the diode.

In the power-supply-side ESD protecting element 2d:
A conduction path starting from the wiring 3 connected to the node N1 and reaching the P$^+$ diffusion layer 4p through a via V1 is formed;
The diode D1 is formed from the P$^+$ diffusion layer 4p and the N$^+$ diffusion layer 4n; and
A conductive path starting from the N$^+$ diffusion layer 4n and reaching the VDD wiring 5d through a via V2 is formed.

In the ground-side ESD protecting element 2s:
A conduction path starting from the VSS wiring 5s and reaching the P$^+$ diffusion layer 4p through the via V1 is formed;
The diode D2 is formed from the P$^+$ diffusion layer 4p and the N$^+$ diffusion layer 4n; and
A conductive path starting from the N$^+$ diffusion layer 4n and reaching the node N1 through the via V2, and further extending to the wiring 3, is formed.

The power-supply-side ESD protecting element 2d and the ground-side ESD protecting element 2s may be divided into a plurality of parts.

According to the present preferred embodiment, the diodes D1 and D2 each comprising the p-type diffusion layer and the N-type diffusion layer constitute the ESD protecting circuit B1 on the input side of the amplifier A. Therefore, the current flow on the ground-wire side or the power-supply-wire side during the oscillation can be limited to such a small amount of current as the junction leak current. As a result, the oscillation waveform having the full amplitude can be obtained on the input and output sides of the amplifier A, and the full amplitude waveform can be outputted from the oscillation output terminal OUT.

As another advantage, the breakdown voltage of the amplifier A and the breakdown voltage of the ESD protecting circuit B2 are equal to each other because the MOS transistor constitutes the ESD protecting circuit B2 on the output side of the amplifier A. As a result, the breakdown of the amplifier A can be prevented even though the surge voltage resulting from the electrostatic discharge is applied from outside to the oscillation circuit.

Preferred Embodiment 2

Figure 4:
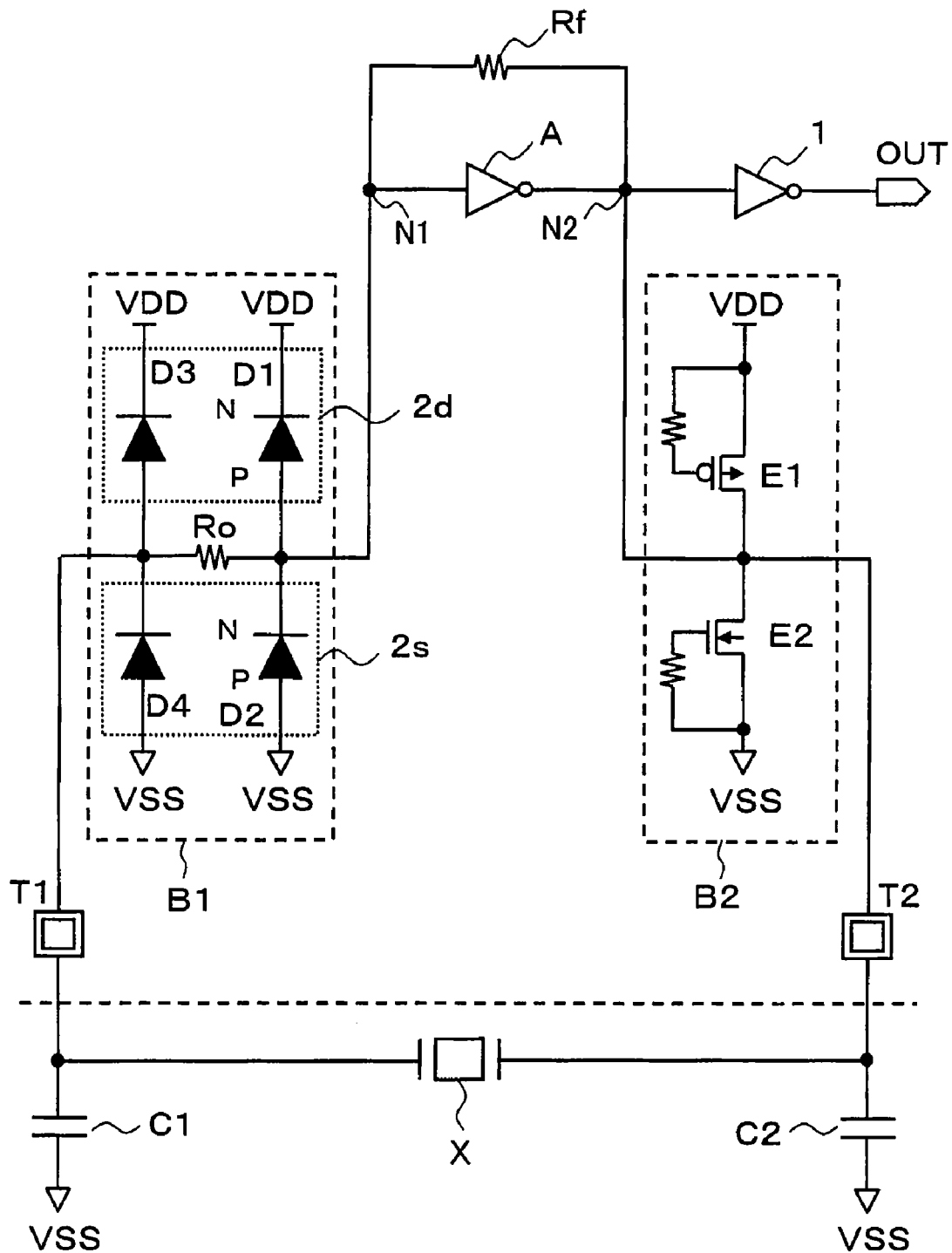
FIG. 4 is a circuit diagram illustrating a constitution of an oscillation circuit according to a preferred embodiment 2 of the present invention

FIG. 4 is a circuit diagram illustrating a constitution of an oscillation circuit according to a preferred embodiment 2 of the present invention. In the present preferred embodiment, the constitution of the ESD protecting circuit B1 on the input side according to the preferred embodiment 1 is changed. In FIG. 4, the same reference symbols as those shown in FIG. 1 according to the preferred embodiment 1 denote the same components. The present preferred embodiment is characterized as follows.

The input-side ESD protecting circuit B1 comprises a resistance element Ro whose constituent is polysilicon, power-supply-side ESD protecting element 2d and ground-side ESD protecting element 2s. The resistance element Ro is inserted into a signal line between the input terminal of the amplifier A and the bonding pad T1. First and second diodes D1 and D3 constitute the power-supply-side ESD protecting element 2d, and third and fourth diodes D2 and DA constitute the ground-side ESD protecting element 2s.

In the first diode D1 constituting the power-supply-side ESD protecting element 2d, an N-type diffusion layer is connected to the power-supply wire VDD, and a P-type diffusion layer is connected to a connecting point between the node N1 on the input side of the amplifier A and the resistance element Ro. In the second diode D3 constituting the power-supply-side ESD protecting element 2d, an N-type diffusion layer is connected to the power-supply wire VDD, and a P-type diffusion layer is connected to a connecting point between the resistance element Ro and the bonding pad T1.

In the third diode D2 constituting the ground-side ESD protecting element 2s, a P-type diffusion layer is connected to the ground wire VSS, and an N-type diffusion layer is connected to the connecting point between the node N1 on the input side of the amplifier A and the resistance element Ro. In the diode D4 constituting the ground-side ESD protecting element 2s, a P-type diffusion layer is connected to the ground wire VSS, and an N-type diffusion layer is connected to the connecting point between the resistance element Ro and the bonding pad T1. The description of the rest of the constitution, which is similar to that of the preferred embodiment, is omitted.

According to the present preferred embodiment, the normal oscillation waveform having the full amplitude can be outputted from the oscillation output terminal OUT in a manner similar to the preferred embodiment 1. There is such an additional effect as follows. When the surge current having a high speed is inputted to the oscillation circuit, the surge current, sometimes, may not be discharged completely by the second and fourth diodes D3 and D4. However, in the present preferred embodiment, such surge current can be completely discharged by the first and third diodes D1 and D2 in the case of the inflow of such surge current. As a result, the ESD breakdown voltage of the oscillation circuit can be improved.

While there has been described what is at present considered to be preferred embodiments of this invention, it will be understood that various modifications may be made therein, and it is intended to cover in the appended claims all such modifications as fall within the true spirit and scope of this invention

What is claimed is:

1. An oscillation circuit comprising:
a solid-state oscillator;
an amplifier for feedback-controlling the solid-state oscillator; and
ESD protecting circuits respectively connected to input and output sides of the amplifier, wherein
the ESD protecting circuit on the input side of the amplifier comprises an ESD protecting element whose constituent is a diode having a P-type diffusion layer and an N-type diffusion layer,
the ESD protecting circuit on the output side of the amplifier comprises an ESD protecting element whose constituent is a MOS transistor, and
the ESD protecting circuit on the input side of the amplifier comprises:
a power-supply-side ESD protecting element; and
a ground-side ESD protecting element, wherein
a diode in which an N-type diffusion layer is connected to a power-supply wire and a P-type diffusion layer is connected to the input side of the amplifier constitutes the power-supply-side ESD protecting element, and
a diode in which a P-type diffusion layer is connected to a ground wire and an N-type diffusion layer is connected to the input side of the amplifier constitutes the ground-side ESD protecting element.

2. The oscillation circuit as claimed in claim 1, wherein a MOS transistor constitutes the amplifier.

3. An oscillation circuit comprising:
a solid-state oscillator;
an amplifier for feedback-controlling the solid-state oscillator; and
ESD protecting circuits respectively connected to input and output sides of the amplifier, wherein
the ESD protecting circuit on the input side of the amplifier comprises an ESD protecting element whose constituent is a diode having a P-type diffusion layer and an N-type diffusion layer,
the ESD protecting circuit on the output side of the amplifier comprises an ESD protecting element whose constituent is a MOS transistor, and
the ESD protecting circuit on the input side of the amplifier comprises:
a resistance element;
a power-supply-side ESD protecting element; and
a ground-side ESD protecting element, wherein
the resistance element is provided on a signal wire for supplying a signal to the amplifier,
a diode in which an N-type diffusion layer is connected to a power-supply wire, a part of a P-type diffusion layer is connected to a connecting point between the amplifier and one end of the resistance element, and another part of the P-type diffusion layer is connected to the other end of the resistance element constitutes the power-supply-side ESD protecting element, and
a diode in which a P-type diffusion layer is connected to the ground wire, a part of an N-type diffusion layer is connected to the connecting point between the amplifier and one end of the resistance element, and another part of the N-type diffusion layer is connected to the other end of the resistance element constitutes the ground-side ESD protecting element.

4. The oscillation circuit as claimed in claim 3, wherein the diode constituting the power-supply-side ESD protecting element comprises:
a first diode in which an N-type diffusion layer is connected to the power-supply wire and a P-type diffusion layer is connected to the connecting point between the amplifier and one end of the resistance element; and
a second diode in which an N-type diffusion layer is connected to the power-supply wire and a P-type diffusion layer is connected to the other end of the resistance element, and
the diode constituting the ground-side ESD protecting element comprises:
a third diode in which a P-type diffusion layer is connected to the ground wire and an N-type diffusion layer is connected to the connecting point between the amplifier and one end of the resistance element; and
a fourth diode in which a P-type diffusion layer is connected to the ground wire and an N-type diffusion layer is connected to the other end of the resistance element.

5. The oscillation circuit as claimed in claim 3, wherein Polysilicon constitutes the resistance element.

* * * * *